United States Patent
Chen et al.

(10) Patent No.: US 12,066,926 B2
(45) Date of Patent: Aug. 20, 2024

(54) CIRCUITRY FOR MEMORY ADDRESS COLLISION PREVENTION

(71) Applicant: Arm Limited, Cambridge (GB)

(72) Inventors: Andy Wangkun Chen, Austin, TX (US); Yew Keong Chong, Austin, TX (US); Sriram Thyagarajan, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/861,084

(22) Filed: Jul. 8, 2022

(65) Prior Publication Data
US 2024/0012748 A1 Jan. 11, 2024

(51) Int. Cl.
*G06F 12/02* (2006.01)

(52) U.S. Cl.
CPC .... *G06F 12/023* (2013.01); *G06F 2212/1008* (2013.01)

(58) Field of Classification Search
None
See application file for complete search history.

(56) References Cited

U.S. PATENT DOCUMENTS

| 5,062,081 A * | 10/1991 | Runaldue ................ G11C 8/16 |
| | | 365/233.5 |
| 7,417,907 B1 | 8/2008 | Liu et al. |
| 2011/0310691 A1 | 12/2011 | Zhou et al. |
| 2022/0310156 A1 * | 9/2022 | Raj ........................ G11C 11/419 |

FOREIGN PATENT DOCUMENTS

| EP | 0149049 A2 | 7/1985 |
| WO | 1991-007754 A1 | 5/1991 |

OTHER PUBLICATIONS

UKIPO Combined Search and Examination Report; GB 2309367.7; Dec. 11, 2023.

* cited by examiner

*Primary Examiner* — Charles Rones
*Assistant Examiner* — Ryan Dare
(74) *Attorney, Agent, or Firm* — Pramudji Law Group PLLC; Ari Pramudji

(57) ABSTRACT

According to one implementation of the present disclosure, an integrated circuit includes comparator circuitry coupled to peripheral circuitry of a multiport memory and configured to transmit one or more data input signals or one or more write enable signals to respective memory outputs when a memory address collision is detected for one or more respective bitcells of the multi-port memory. In another implementation, a method comprises: detecting a read operation and a write operation to a same memory bitcell of a multiport memory in one clock cycle and in response to the detection, performing the read operation of a data input signal or a write enable signal of the multiport memory.

19 Claims, 6 Drawing Sheets

| CLKA=CLKB | DFTRAMBYP | GWENB | QA | QB | MODE |
|---|---|---|---|---|---|
| R | 1 | X | (DB \| WENB) | (DB \| WENB) | Capture from D/WEN, Launch to Qs (synchronous clock, or CLKB) |
| R | 0 | 1 | MEM(@AA) | MEM(@AB) | Functional mode - read/read |
| R | 0 | 0 (AA!=AB) | MEM(@AA) | QB | Functional mode - read/write |
| R | 0 | 0 (AA==AB) | X | QB | Existing Design: Functional mode - read/write (AA==AB), QA is corrupted |
| R | 0 | 0 (AA==AB) | (DB \| WENB) | QB | Proposed Design: Functional mode - read/write (AA==AB), QA has correct data |

FIG. 4

CIRCUITRY FOR MEMORY ADDRESS COLLISION PREVENTION

I. FIELD

The present disclosure is generally related to circuitry to prevent memory address collisions.

II. DESCRIPTION OF RELATED ART

Advances in technology have resulted in smaller and more powerful computing devices. For example, a variety of personal computing devices, including wireless telephones, such as mobile and smart phones, gaming consoles, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. For such devices, there is an ever-increasing demand for greater efficiency in power, performance, and area (PPA) for memory storage capacity and read/write capabilities.

In current memory designs, in the event of an address collision (i.e., when a read operation and write operation is performed on the same memory address at the same time), the write operation would occur as expected as memory content would be successfully updated. However, the read operation would incur an error and result in an unknown value. In such instances, a separate register transfer language (RTL) assertion instruction would have to be implemented to a verification tool to confirm the read operation. As may be appreciated, such occurrences would be considered a hazard in CPU architecture design.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

FIG. 4 is a table corresponding to operations of the example circuits of FIG. 1-3 in accordance with various implementations described herein.

Figure 1:
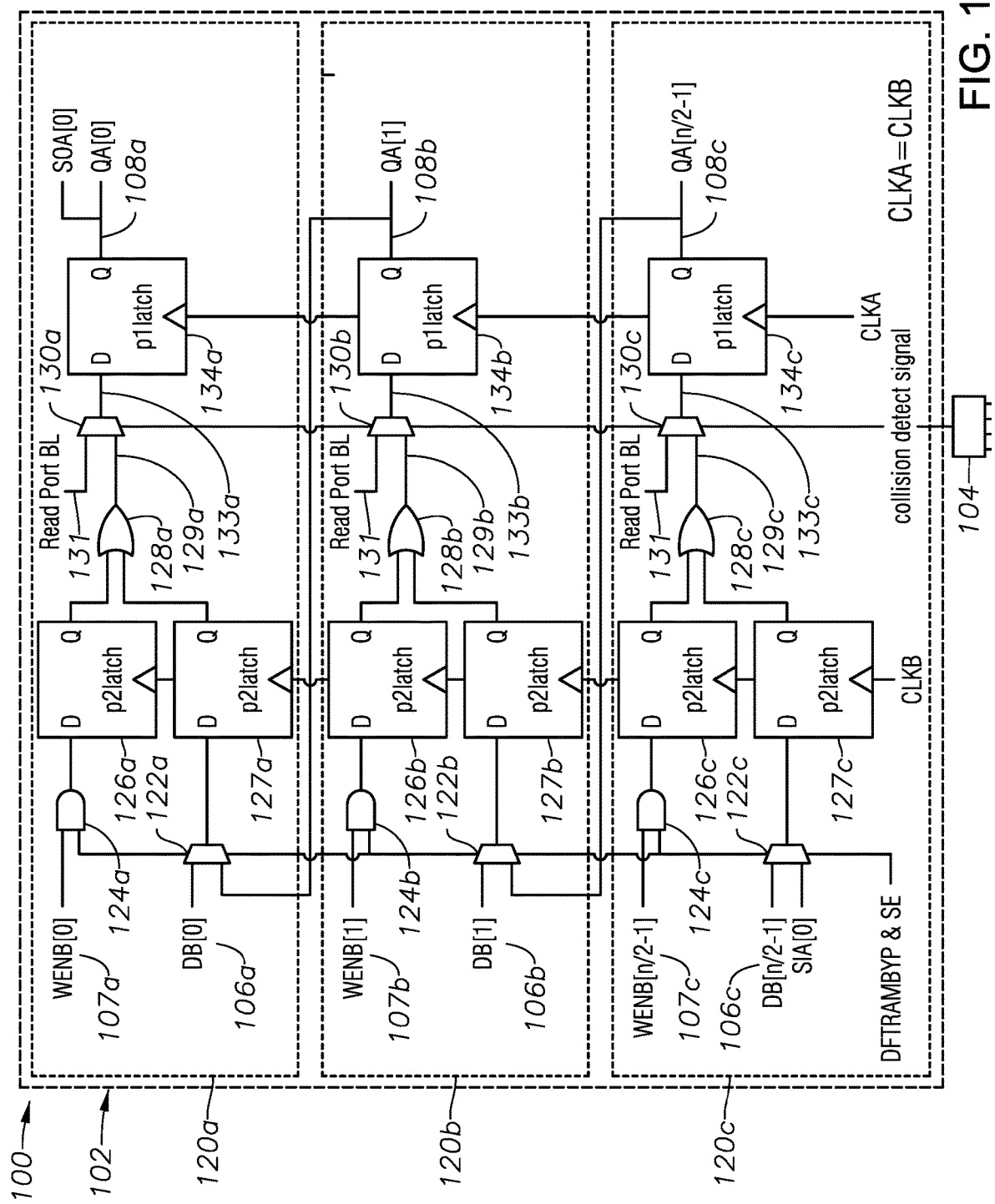
FIG. 1 is a schematic diagram of a portion of an example circuit in accordance with various implementations described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

According to one implementation of the present disclosure, an integrated circuit includes comparator circuitry coupled to peripheral circuitry of a multiport memory and configured to transmit one or more data input signals or one or more write enable signals to respective memory outputs when a memory address collision is detected for one or more respective bitcells of the multi-port memory.

According to another implementation, a method comprises: detecting a read operation and a write operation to a same memory bitcell of multiport memory in one clock cycle; and in response to the detection, performing the read operation of a data input signal or a write enable signal of the multiport memory.

According to another implementation, a computer-readable storage medium comprising instructions that, when executed by a processor, cause the processor to perform operations including: in response to a detection, by a multiport memory, of a read operation and a write operation to a same memory bitcell of the multiport memory in one cycle, performing the read operation of a data input (DB) of the multiport memory bitcell in the one cycle.

Advantageously, the inventive aspects of the present invention allow for power, performance, area (PPA) efficiency in circuit configurations by preventing memory collisions in multiport memory. In particular, certain schemes and techniques described herein provide for memory bypass circuitry that reads directly from a data input signal or write enable signal itself rather than a particular memory address of multiport memory. Also, according to inventive aspects, for example, when a first port may be instructed to read from a memory address and a second port may be instructed to write to the same memory address, the inventive aspects allows for greater efficiency (by saving steps in operation) by writing directly to the memory output instead of waiting for a write operation of the bitcell and a subsequent read operation of the bitcell.

Referring to FIG. 1, circuitry 100 of an integrated circuit (e.g., circuitry of multiport memory) is shown according to example implementations. As illustrated, in certain implementations, the circuitry 100 may be a bypass circuitry of a one-read/one-write (1R1W) multi-port memory. In certain instances, the multi-port memory may be comprised of random-access memory (RAM)). As depicted in FIG. 1, the circuitry 100 may include: peripheral circuitry 102 coupled to comparator circuitry 104. The peripheral circuitry 102 may be configured to receive one or more data input signals 106 (e.g., 106a, 106b, 106c, etc.) (i.e., data input) (DB) (e.g., DB[0], DB[1] . . . DB[n/2−1]) or one or more write enable signals 107 (e.g., 107a, 107b, 107c, etc.) (i.e., write enable) (WEN) (e.g., WEN[0], WEN[1], WEN[n/2−1] and transmit respective output signals corresponding to respective memory outputs 108 (QA) (e.g., QA[0], QA[1] . . . DB[n/2−1]). Also, the comparator circuitry 104 may be configured to transmit the one or more data input signals (i.e. DB (e.g., data-bus)) 106 or the write enable signals 107 directly to the respective memory outputs (QA) 108. Advantageously, the circuitry 100 allows for data to be read directly from a data input DB or write enable WEN when a memory address collision (e.g., memory address A (AA)==memory address B (AB)) is detected by the comparator circuitry 104 for one or more respective bitcells (in at least one memory array (not shown) of the multiport memory.

The peripheral circuitry 102 may include one or more data input sections 120 (e.g., 120a, 120b, 120c, etc.), where each data input sections 120 can include: a first multiplexer 122 (e.g., 122a, 122b, 122c, etc.) configured to receive the data input signal 106 (e.g., 106a, 106b, 106c, etc.) an AND gate 124 (e.g., 124a, 124b, 124c, etc.) configured to receive the write enable signal 107 (e.g., 107a, 107b, 107c, etc.); first and second latches 126, 127 (e.g., 126a, 127a; 126b, 127b; 127c, 127c, etc.) (e.g., first and second clock circuitry) configured to receive the output of the AND gate 124 and output the respective signals to an OR gate 128 (e.g., 128a, 128b, 128c, etc.); a second multiplexer 130 (e.g., 130a, 130b, 130c, etc.) configured to receive an output signal 129 (e.g., 129a, 129b, 129c, etc.) of the OR gate 128 and an output signal from a read bitline (i.e., read port BL) corresponding to the output of one or more respective bitcells; and a third latch 134 (e.g., 134a, 134b, 134c, etc.) configured to receive an output signal 133 (e.g., 133a, 133b, 133c, etc.) from the second multiplexer 130 and transmit a memory output signal 108 (e.g., 108a, 108b, 108c, etc.) (QA). Advantageously, as an example, the output QA, corresponding to port A, would be a "read" port.

In certain instances, the first and second latches 126, 127 may be configured to receive a first clock signal (CLKB) (i.e., a first synchronous clock) and the third latch 134 may be configured to receive a second clock signal (CLKA) (i.e., a second synchronous clock signal). In certain implementations, the first clock signal is equivalent to the second clock signal (i.e., CLKA=CLKB).

In certain implementations, the detection of the read and the write operation to the same memory bitcell would occur at the comparator circuitry 104. Moreover, in operation, the second multiplexer 130 may select between the output signal 129 (corresponding to the data input 106 or write enable signal 107) and the Read Port BL 131 (corresponding to the data stored in one or more memory bitcells of the multiport memory).

Also, as shown in FIG. 1, to allow for selection of inputs at the first multiplexer 122, a design-for-test RAM bypass (DFTRAMBYP) may be set to a digital "1" while a scan enable signal (SE) may be set to a digital "0". The scan enable signal may be configured to control two separate modes: 1) scan shift mode when set to a digital "1" and 2) a scan capture mode when set to a digital "0". In doing so, in a functional mode, the peripheral circuitry 102 can take in data from the data input 106 or write enable 107. In such an implementation, in operation, when design-for test RAM bypass (DFTRAMBYP)=1, the circuit 100 would bypass the memory array(s) and propagate the data input (DB) to the memory output (QA) directly. Such an implementation would be a full-bypass operation regardless of the operation of the comparator circuitry 104 (when determining whether a memory collision has taken place).

In another implementation, when DFTRAMBYP=0 and collision detect signal=0 (as described with reference to FIGS. 2 and 4), the comparator 104 of the circuit 100 is configured to detect address collision (e.g., AA=AB & !CENA & !CENB & !GWENB as described with reference to FIG. 4). If collision is in fact detected, the inventive circuit 100 would be enabled to transmit the data input (DB) or the write enable (WEN) to the memory output (QA) (instead of transmitting data from one or more bitcells of the memory array to the memory output). Advantageously, such a technique would prevent the hazard of memory output (QA) corruption. Accordingly, schemes and techniques as described herein are configured to prevent a memory address collision when a read operation and a write operation is performed on the same memory address in the same clock cycle.

In certain implementations, the circuit design operation would be initiated in a control logic of a larger integrated circuit (e.g., multiport memory). The integrated circuit would include at least the circuitry 100 (including peripheral circuitry 102 and comparator circuit 104) and one or more memory arrays. In some instances, the control logic may be configured to activate a memory bypass signal (DFTRAMBYP) to allow for the transmission of the one or more data inputs (DB) signals or the one or more write enable (WEN) signals to the respective memory outputs (QA) directly (e.g., full bypass circuitry option). In certain instances, such a control logic would be implemented as a compiler option outside of the memory array(s) of the multiport memory.

Figure 2:
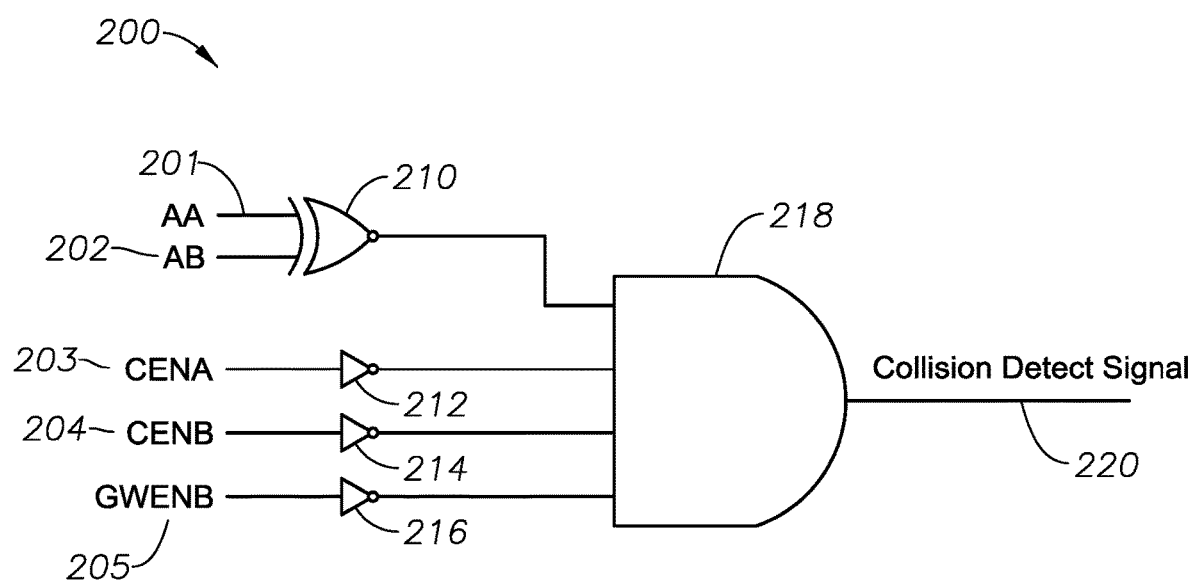
FIG. 2 is a schematic diagram of a circuit in accordance with various implementations described herein.

Referring to FIG. 2, comparator circuitry 104 implementable with the peripheral circuitry 102 is shown according to example implementations. As illustrated, the comparator circuitry 104 may include five inputs, memory address A (i.e., AA, memory address signal A) 201, memory address B (i.e., AB, memory address signal B) AB 202, chip enable A (i.e., CENA) 203, chip enable B (i.e., CENB) 204, and global write enable B (i.e., GWENB) 205. In the comparator circuitry 102, the inputs AA 201 and AB 202 may be transmitted as inputs to an XNOR gate 210, whose output is then transmitted as input to an AND gate 218. Also, the inputs CENA 203, CENB 204, and GWENB 205 may be each transmitted to respective inverters 212, 215, and 216, where each output is also input to the AND gate 218. In addition, output from the AND gate 218 is a collision detect signal 220. In one example operation, the inputs to the AND gate 218 would be a digital "1", the comparator would output the collision detect signal 220 signal as high (e.g., a digital "0") to activate the circuitry 100 and perform a read operation of a data input signal (DB) 106 or write enable signal (WEN) 107 directly from the input of the peripheral circuitry 102, instead of reading from data stored in one or more respective bitcells of a memory array of the multi-port memory. In other example operations, the circuit 100 may read data from the bitline read port (i.e., Read Port BL).

Figure 3:
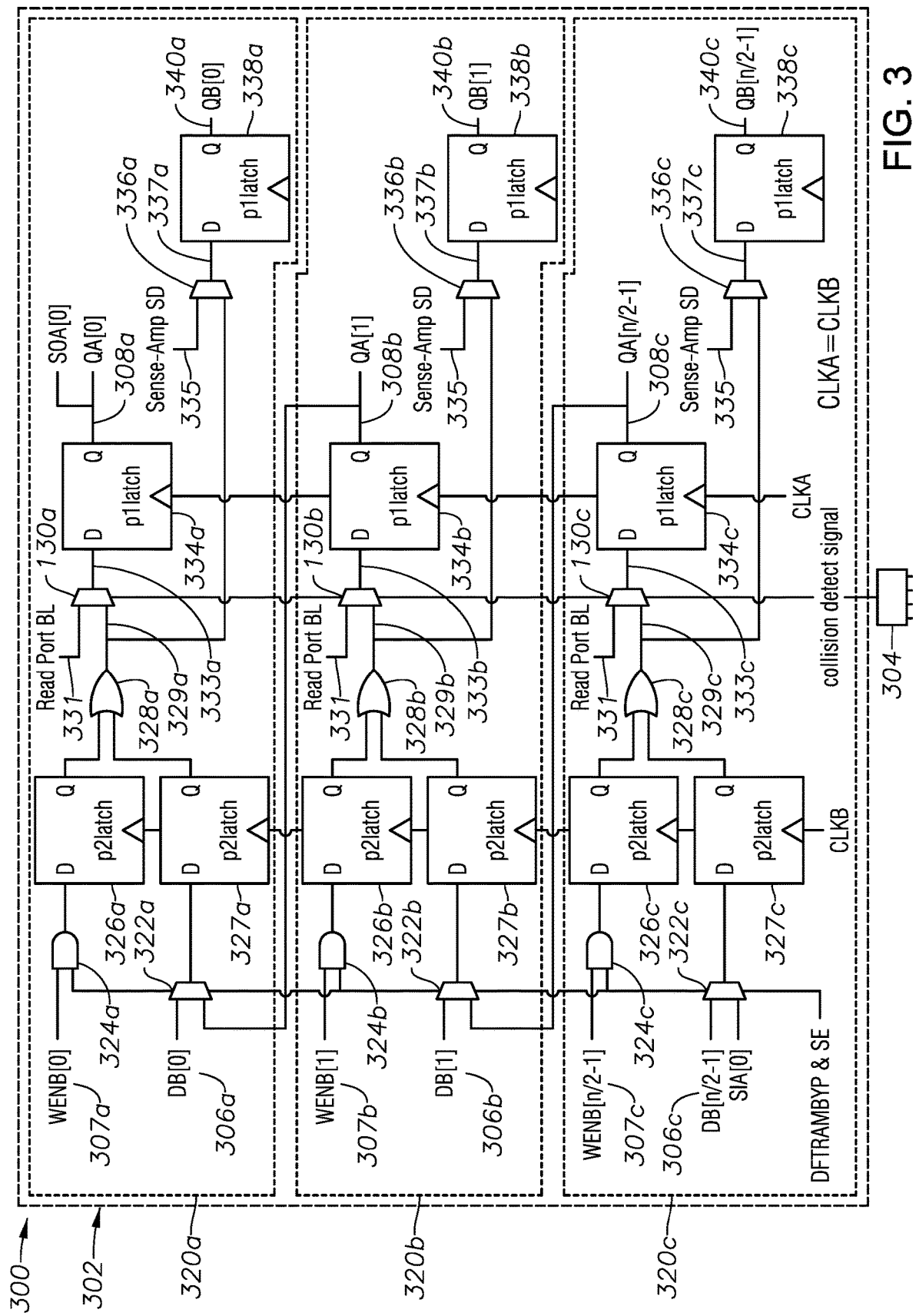
FIG. 3 is a schematic diagram of a portion of an example circuit in accordance with various implementations described herein.

Referring to FIG. 3, a circuitry 300 of an integrated circuit is shown according to example implementations. As illustrated, in certain implementations, the circuitry 300 may be a bypass circuitry of a one-read and one-read/write (1R1RW) multi-port memory. In certain instances, the multi-port memory may be comprised of random-access memory (RAM)). As depicted in FIG. 3, the circuitry 300 may include: peripheral circuitry 302 coupled to comparator circuitry 304. The peripheral circuitry 302 may be configured to receive one or more data input signals 306 (e.g., 306a, 306b, 306c, etc.) (i.e., data input) (DB) (e.g., DB[0], DB[1] . . . DB[n/2−1]) or one or more write enable signals 107 (e.g., 107a, 107b, 107c, etc.) (i.e., write enable) (WEN) (e.g., WEN[0], WEN[1], WEN[n/2−1] and transmit respective output signals corresponding to respective memory outputs 308 (QA) (e.g., QA[0], QA[1] . . . DB[n/2−1]). Also, the comparator circuitry 304 may be configured in certain implementations to transmit the one or more data input signals (DB) 306 or one or more write enable signals (WEN) 307 directly to the respective memory outputs (QB) 340 (i.e., 340a, 340b, 340c). Advantageously, the comparator circuitry 304 allows for data to be read directly from a data input or write enable when a memory address collision (e.g., memory address A (AA)==memory address B (AB)) is detected for one or more respective bitcells of the multiport memory.

The peripheral circuitry 302 may include one or more data input sections 320 (e.g., 320a, 320b, 320c, etc.), where each data input sections 320 can include: a first multiplexer 322 (e.g., 322a, 322b, 322c, etc.) configured to receive a data input signal 306 (e.g., 306a, 306b, 306c, etc.); an AND gate 324 (e.g., 324a, 324b, 324c, etc.) configured to receive a write enable signal 307 (e.g., 307a, 307b, 307c, etc.); first and second latches 326, 327 (e.g., 326a, 327a; 326b, 327b; 327c, 327c, etc.) (e.g., first and second clock circuitry) configured to receive the data input signal 306 and the write enable signal 307 and output the respective signals to an OR gate 328 (e.g., 328a, 328b, 328c, etc.); a second multiplexer 330 (e.g., 330a, 330b, 330c, etc.) configured to receive an output signal 329 (e.g., 329a, 329b, 329c, etc.) of the OR gate 328 and an output signal from a read bitline (i.e., read port BL) corresponding to the one or more respective bitcells; and a third latch 334 (e.g., 334a, 334b, 334c, etc.) configured to receive an output signal 333 (e.g., 333a, 333b, 333c, etc.) from the second multiplexer 330 and transmit a memory output signal 308 (e.g., 308a, 308b, 308c, etc.) (QA). Advantageously, as an example, the output QA, corresponding to port A, would be a "read" port.

In certain implementations, the first and second latches 326, 327 may be configured to receive a first clock signal (CLKB) (i.e., a first synchronous clock) and the third latch 334 may be configured to receive a second clock signal (CLKA) (i.e., a second synchronous clock signal). In certain implementations, the first clock signal is equivalent to the second clock signal (i.e., CLKA=CLKB).

In certain implementations, for each data input section 320, the output of the OR gate 328 (e.g., 328a, 328b, 328c, etc.) may also be coupled to as an input to a third multiplexer 336 (e.g., 336a, 336b, 336c, etc.). The third multiplexer 336 may also receive an input signal received from a sense amplifier of the memory array (Sense-Amp SD) 335. Next, the output of the third multiplexer 330 can be input to a respective fourth latch 338 (e.g., 338a, 338b, 338c, etc.), where the output of the fourth latch 338 would be an output QB. Advantageously, as an example, the output QB, corresponding to port B, would be a "write" port. In operation, a memory address collision may be detected when a read operation and a write operation is performed on the same at least one or more respective bitcells in one clock cycle.

In certain implementations, the detection of the read and the write operation to the same memory bitcell would occur at the comparator circuitry 304. Moreover, in operation, the second multiplexer 330 may select between the output signal 329 (corresponding to the data input 306 or write enable signal 307) and the Read Port BL 331 (corresponding to the data stored in one or more memory bitcells of the multiport memory).

Also, as shown in FIG. 3, to allow selection of inputs to the first multiplexer 322, a design-for-test RAM bypass (DFTRAMBYP) may be set to a digital "1" while a scan enable signal (SE) may be set to a digital "0". The scan enable signal may be configured to control two separate modes: 1) scan shift mode when set to a digital "1" and 2) a scan capture mode when set to a digital "0". In doing so, in a functional mode, the peripheral circuitry 302 can take in data from the data input 306 or write enable 307. In such an implementation, in operation, when design-for test RAM bypass (DFTRAMBYP)=1, the circuit 300 would bypass the memory array(s) and propagate the data input (DB) to the memory output (QA) or to the memory output (QB) directly. Such an implementation would be a full-bypass operation regardless of the operation of the comparator circuitry 304 (when determining whether a memory collision has taken place).

In another implementation, when DFTRAMBYP=0 and collision detect signal=0 (as described with reference to FIGS. 2 and 4), the comparator 304 of the circuit 300 is configured to detect address collision (e.g., AA=AB & !CENA & !CENB & !GWENB as described with reference to FIG. 4). If collision is in fact detected, the inventive circuit 300 would be enabled to transmit the data input (DB) or the write enable (WEN) to the memory output (QA) or the memory output (QB) (instead of transmitting data from one or more bitcells of the memory array to the memory output). Advantageously, such a technique would prevent the hazard of memory output corruption. Accordingly, schemes and techniques as described herein are configured to prevent a memory address collision when a read operation and a write operation is performed on the same memory address in the same clock cycle.

In certain implementations, the circuit design operation would be initiated in a control logic of a larger integrated circuit (e.g., multiport memory). The integrated circuit would include at least the circuitry 300 (including peripheral circuitry 302 and comparator circuit 304) and one or more memory arrays. In some instances, the control logic may be configured to activate a memory bypass signal (DFTRAMBYP) to allow for the transmission of the one or more data inputs (DB) signals or the one or more write enable (WEN) signals to the respective first or second memory outputs QA, QB directly (e.g., full bypass circuitry option). In certain instances, such a control logic would be implemented as a compiler option outside of the memory array(s) of the multiport memory.

According to inventive aspects, for example, when Port A is reading from a memory address and Port B is writing to the same memory address, the inventive circuit 300 allows for greater efficiency by saving steps in operation through writing directly to the output instead of waiting for a write operation of the bitcell and a subsequent read operation the bitcell.

Referring to FIG. 4, a table 400 is shown according to example implementations. As depicted, the table 400 illustrates the various modes of operation. For example, in a first mode, when design-for-test RAM bypass (i.e., DFTRAMBYP) is a digital "1" (e.g., high) (e.g., full circuitry bypass option) and global write enable signal B (i.e., GWENB) may be unknown, outputs QA and QB would transmit signal data input (DB) and/or write enable B (WENB). Accordingly, in the first mode (i.e., full-bypass option), data may be captured from the data input and write enable and transmitted to the QA and QB or the synchronous clocks (CLKA or CLK B) directly (regardless of whether a memory collision has taken place).

In a second mode, when design-for-test RAM bypass (i.e., DFTRAMBYP) is a digital "0" (e.g., low) (e.g., when full-bypass is "off") and global write enable signal B (i.e., GWENB) may be a digital "1" (e.g., when read operations are happening so there would be hazard), QA would transmit the data read from memory address A (AA), while QB would transmit the data read from memory address B (AB). Accordingly, in the second mode, a read-read operation may be performed.

In a third mode, when design-for-test RAM bypass (i.e., DFTRAMBYP) is a digital "0" (e.g., low) and global write enable signal B (i.e., GWENB) may also be a digital "0" (e.g., a simultaneous read and write operation; but because memory address A (AA) does not equal (!=) memory address B (AB), there would be no memory collision), QA would transmit the data read from AA, while data output QB would be the written data at QB. Accordingly, in the third mode, a read-write operation may be performed.

In a fourth mode, highlighting a problem scenario, when design-for-test RAM bypass (i.e., DFTRAMBYP) is a digital "0" (e.g., low) and global write enable signal B (i.e., GWENB) may be a digital "0", while memory address A (AA) does equal (==) memory address B (AB) (such that there would be a memory collision), QA would output an unknown error (X), while the data output QB would be the previously written data QB. This mode would result in a hazard.

In a fifth mode, highlighting one inventive design to correct for the fourth mode problem scenario, when design-for-test RAM bypass (i.e., DFTRAMBYP) is a digital "0" (e.g., low) and global write enable signal B (i.e., GWENB) may be a digital "0", while memory address A (AA) does equal (==) memory address B (AB) (such that there would be a memory collision), QA would output the data input (DB) or write enable B (WENB) while the data output QB would be the previously written data QB. Advantageously, in this mode, QA would have the correct data even though a memory address collision was detected (AA==AB) because QA corresponds to the data input D or write enable B.

Figure 5:
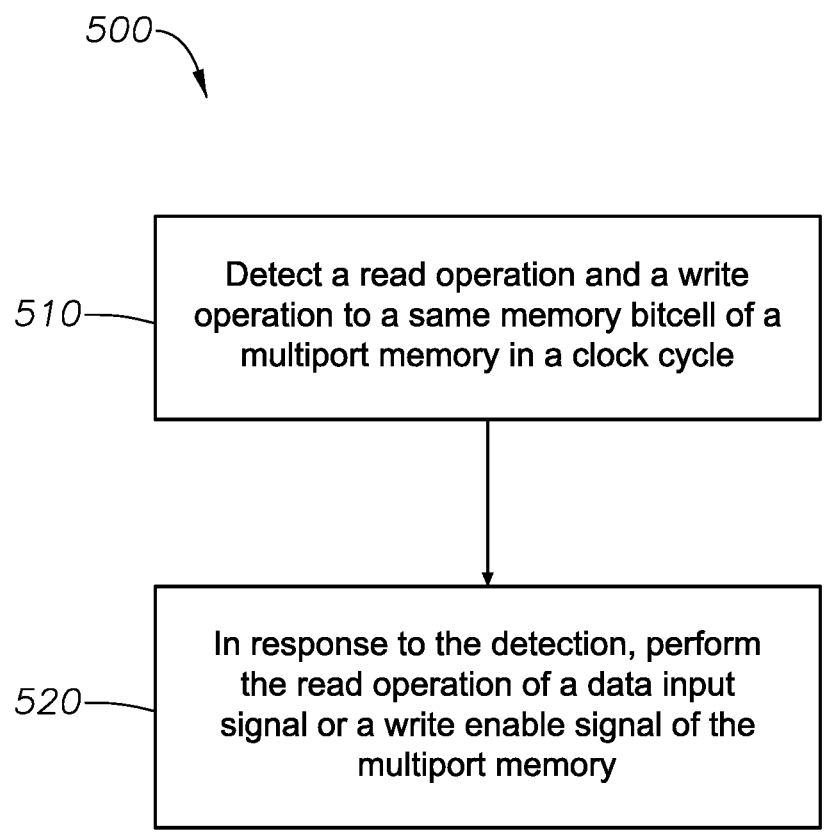
FIG. 5 is an operation method in accordance with various implementations described herein.

Referring to FIG. 5, a flowchart of an example operational method 500 (i.e., procedure) for operations to prevent a memory address collision is shown. Advantageously, in various implementations, the method 500 would support performance requirements of memory architecture in real-time. The method 500 may be implemented with reference to circuit implementations as shown in FIGS. 1-3.

At block 510, the method includes: detecting a read operation and a write operation to a same memory bitcell of a multiport memory in a clock cycle. For instance, with reference to FIGS. 1-3, a read operation and a write operation to a same memory bitcell of a multiport memory may be detected at the comparator circuitry 104.

At block 520, the method includes: in response to the detection, performing the read operation of a data input (DB) signal or write enable signal (WE) of the multiport memory. For instance, with reference to FIGS. 1-3, a read operation may be performed (directly) from the data input 106, 306 or the write enable 107, 307 of a multiport memory.

According to certain implementations, the method may include the read operation of a data input (DB) of the multiport memory bitcell occurring in the clock cycle. In an example implementation, the read and the write operation to the same memory bitcell is detected at the comparator circuitry 104.

In other example implementations, the method may include: in response to the detection, by the multi-port memory, obstructing a read operation of one or more output signals transmitted on respective read bitlines from the one or more respective bitcells. For instance, with reference to the description of FIGS. 1-3, a read operation of data transmitted on respective read bitlines from the one or more respective bitcells may be obstructed at the second multiplexer 130, 330 that receives an input from the read port bitline (i.e. read port BL) 131, 331.

In other example implementations, the method may include: in response to the detection, by the multi-port memory, obstructing a read operation of data stored in the one or more respective bitcells. For instance, with reference to the description of FIGS. 1-3, a read operation of data stored in the one or more respective bitcells may be obstructed at the second multiplexer 130, 330.

In other example implementations, the method may include: when there is no detection, by the comparator circuitry 104, of the read operation and the write operation to the same memory bitcell, the read operation is performed on the data stored in the one or more respective bitcells. For instance, with reference to the description of FIGS. 1-3, a read operation of data stored on the one or more respective bitcells may be received from the read port bitline (i.e. read port BL) 131, 331 and selected by the second multiplexer 130, 330 to transmitted to a memory output QA.

Also, according to other aspects of a design method associated with the circuits 100, 200, 300, an output may be generated. For example, with reference to various implementations as described in FIGS. 1-5, an output (i.e., an integrated circuit design) (e.g., a memory architecture, multi-threshold offerings for memory compilers) may be generated based on a selection of circuit design optimizations. In some implementations, the circuit design tool 624 (as described with reference to FIG. 6) may allow circuit designers to select the design in a compiler option.

Figure 6:
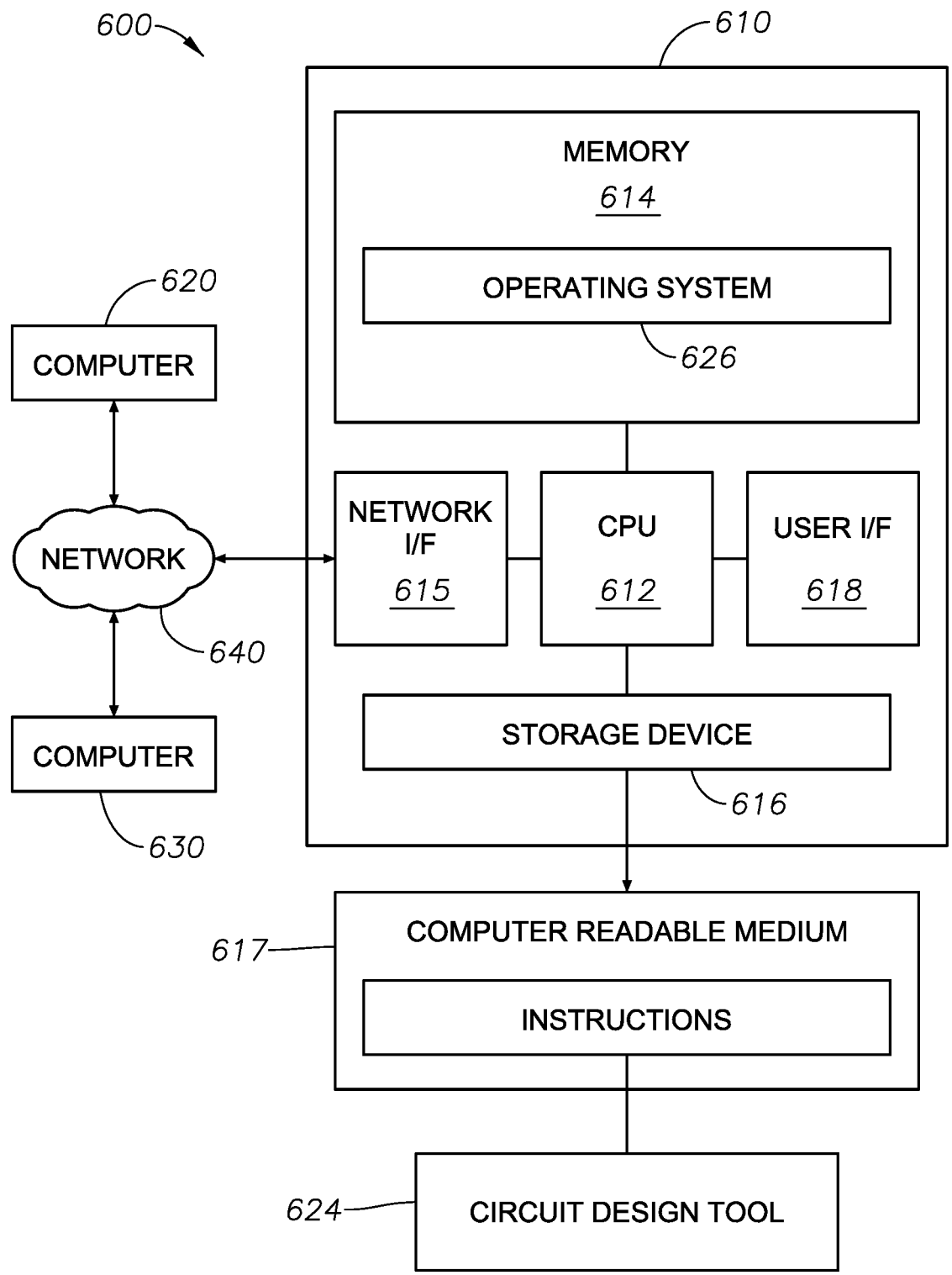
FIG. 6 is a block diagram in accordance with various implementations described herein.

FIG. 6 illustrates example hardware components in the computer system 600 that may be used to provide for a memory bypass operation to prevent an address collision and to generate an integrated circuit design/memory architecture output. In certain implementations, the example computer system 600 (e.g., networked computer system and/or server) may include circuit design tool 624) and execute software based on the procedure as described with reference to the method 500 in FIG. 5. In certain implementations, the circuit design tool 624 may be included as a feature of an existing memory compiler software program.

The circuit design tool 624 may provide generated computer-aided physical layout designs for memory architecture. The procedure 500 may be stored as program code as instructions 617 in the computer readable medium of the storage device 616 (or alternatively, in memory 614) that may be executed by the computer 610, or networked computers 620, 630, other networked electronic devices (not shown) or a combination thereof. In certain implementations, each of the computers 610, 620, 630 may be any type of computer, computer system, or other programmable electronic device. Further, each of the computers 610, 620, 630 may be implemented using one or more networked computers, e.g., in a cluster or other distributed computing system.

In certain implementations, the system 600 may be used with semiconductor integrated circuit (IC) designs that contain all standard cells, all blocks or a mixture of standard cells and blocks. In a particular example implementation, the system 600 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 600 may be stored in one or more of memory 614 or storage devices 616 of computer 610 or in networked computers 620, 630.

The system 600 may perform the following functions automatically, with variable user input: determination of read current requirements/thresholds, determination of leakage current requirements/thresholds, identification of logic designs (i.e., periphery circuit designs (i.e., logic threshold voltages, threshold voltage implant layers)), determination of a desired threshold voltage-combination, determination of minimum voltage assist requirements, identification of bit-cell types, determination of memory specific optimization modes (memory optimization mode), floor-planning, including generation of cell regions sufficient to place all standard cells; standard cell placement; power and ground net routing; global routing; detail routing and pad routing. In some instances, such functions may be performed substantially via user input control. Additionally, such functions can be used in conjunction with the manual capabilities of the system 600 to produce the target results that are required by a designer. In certain implementations, the system 600 may also provide for the capability to manually perform functions such as: cell region creation, block placement, pad and cell placement (before and after automatic placement), net routing before and after automatic routing and layout editing. Moreover, verification functions included in the system 600 may be used to determine the integrity of a design after, for example, manual editing, design rule checking (DRC) and layout versus schematic comparison (LVS).

In one implementation, the computer 600 includes a central processing unit (CPU) 612 having at least one hardware-based processor coupled to a memory 614. The memory 614 may represent random access memory (RAM) devices of main storage of the computer 610, supplemental levels of memory (e.g., cache memories, non-volatile or backup memories (e.g., programmable or flash memories)), read-only memories, or combinations thereof. In addition to the memory 614, the computer system 600 may include other memory located elsewhere in the computer 610, such as cache memory in the CPU 612, as well as any storage capacity used as a virtual memory (e.g., as stored on a storage device 616 or on another computer coupled to the computer 610).

The computer 610 may further be configured to communicate information externally. To interface with a user or operator (e.g., a circuit design engineer), the computer 610 may include a user interface (I/F) 618 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 610 may include a network interface (I/F) 615 which may be coupled to one or more networks 640 (e.g., a wireless network) to enable communication of information with other computers and electronic devices. The computer 660 may include analog and/or digital interfaces between the CPU 612 and each of the components 614, 615, 616, and 618. Further, other non-limiting hardware environments may be used within the context of example implementations.

The computer 610 may operate under the control of an operating system 626 and may execute or otherwise rely upon various computer software applications, components, programs, objects, modules, data structures, etc. (such as the programs associated with the method 500 and related software). The operating system 628 may be stored in the memory 614. Operating systems include, but are not limited to, UNIX® (a registered trademark of The Open Group), Linux® (a registered trademark of Linus Torvalds), Windows® (a registered trademark of Microsoft Corporation, Redmond, WA, United States), AIX® (a registered trademark of International Business Machines (IBM) Corp., Armonk, NY, United States) i5/OS® (a registered trademark of IBM Corp.), and others as will occur to those of skill in the art. The operating system 626 in the example of FIG. 6 is shown in the memory 614, but components of the aforementioned software may also, or in addition, be stored at non-volatile memory (e.g., on storage device 616 (data storage) and/or the non-volatile memory (not shown). Moreover, various applications, components, programs, objects, modules, etc. may also execute on one or more processors in another computer coupled to the computer 610 via the network 640 (e.g., in a distributed or client-server computing environment) where the processing to implement the functions of a computer program may be allocated to multiple computers 620, 630 over the network 640.

In example implementations, circuit diagrams have been provided in FIGS. 1-3, whose redundant description has not been duplicated in the related description of analogous circuit macro diagrams. It is expressly incorporated that the same cell layout diagrams with identical symbols and/or reference numerals are included in each of embodiments based on its corresponding figure(s).

Although one or more of FIGS. 1-6 may illustrate systems, apparatuses, or methods according to the teachings of the disclosure, the disclosure is not limited to these illustrated systems, apparatuses, or methods. One or more functions or components of any of FIGS. 1-6 as illustrated or described herein may be combined with one or more other portions of another of FIGS. 1-6. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 614, the storage device 616, or both, may include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A circuit comprising:
    comparator circuitry coupled to peripheral circuitry to a multiport memory, wherein the comparator circuitry is configured to transmit one or more data input signals or one or more write enable signals from respective inputs of the peripheral circuitry to respective memory outputs when a memory address collision is detected for one or more respective bitcells of the multi-port memory, wherein the peripheral circuitry comprises one or more data input sections, wherein:
    for each data input section:
        a first multiplexer is configured to receive a data input signal;
        an AND gate is configured to receive a write enable signal; and
        first and second latches are configured to receive the data input signal and the write enable signal and output the respective signals to an OR gate.

2. The circuit of claim 1, wherein the circuit comprises a memory bypass circuitry, and wherein the memory bypass circuitry comprises a full bypass of the multiport memory.

3. The circuit of claim 1, wherein the peripheral circuitry is distinct from the multi-port memory, and wherein the memory address collision is detected when a read operation and a write operation is performed on at least one of the one or more respective bitcells in one clock cycle.

4. The circuit of claim 3, wherein in response to the detection, by the comparator circuitry, the circuit is configured to perform a read operation of the one or more data input signals or one or more write enable signals of the multi-port memory.

5. The circuit of claim 3, wherein in response to the detection, by the comparator circuitry, the circuit is configured to obstruct a read operation of data stored in the one or more respective bitcells.

6. The circuit of claim 5, wherein the circuit is configured to obstruct transmission from respective read bitlines corresponding to the one or more respective bitcells.

7. The circuit of claim 1, wherein the comparator circuitry is configured to transmit one or more data input signals or one or more write enable signals directly from respective inputs of the peripheral circuitry to the respective memory outputs, and further comprising:
    control logic configured to activate a memory bypass signal to transmit the one or more data inputs signals or one or more write enable signals to the respective memory outputs.

8. The circuit of claim 1, wherein each of the data input sections of the peripheral circuitry comprises:
    a second multiplexer configured to receive an output signal of the OR gate and an output signal from a read bitline corresponding to the one or more respective bitcells; and
    a third latch configured to receive an output signal from the second multiplexer and transmit an output signal of the third latch to a respective first memory output of the respective memory outputs.

9. The circuit of claim 8, wherein each of the data input sections of the peripheral circuitry comprises:
    a third multiplexer configured to the receive the output signal of the OR gate and a sense amplifier output signal; and
    a fourth latch configured to receive an output signal of the third multiplexer, wherein the output of the fourth latch corresponds to a respective second memory output of the respective memory outputs.

10. The circuit of claim 8, wherein the output signal of the OR gate is transmitted as a first input to a third multiplexer, wherein a sense amplifier signal is transmitted as a second input of the third multiplexer, wherein an output of the third multiplexer is transmitted to a fourth latch, and wherein an output signal of the fourth latch corresponds to a respective second memory output of the respective memory outputs.

11. A method comprising:
    detecting, by a comparator circuitry, a read operation and a write operation to a same memory bitcell of a multiport memory in a clock cycle; and
    in response to the detection, performing the read operation of a data input signal or a write enable signal from a respective input of peripheral circuitry to the multi-port memory wherein:
    the peripheral circuitry is coupled to the comparator circuitry; and
    the peripheral circuitry comprises: one or more data input sections, wherein:
    for each data input section:
        a first multiplexer is configured to receive the data input signal;
        an AND gate is configured to receive the write enable signal; and
        first and second latches are configured to receive the data input signal and the write enable signal and output the respective signals to an OR gate.

12. The method of claim 11, wherein the data input signal is transmitted to a memory output of the multiport memory.

13. The method of claim 11, further comprising:
    in response to the detection, by the comparator circuitry, obstructing a read operation of data stored in the one or more respective bitcells.

14. The method of claim 11, further comprising:
    in response to the detection, by the comparator circuitry, obstructing transmission of one or more output signals on respective read bitlines from the one or more respective bitcells.

15. The method of claim 11, wherein the read operation of the data input signal or write enable signal of the multiport memory is performed in the clock cycle.

16. The method of claim 11, wherein the read and the write operations are detected at the comparator circuitry.

17. The method of claim 11, wherein if there is no detection, by the comparator circuitry, of the read operation and the write operation to the same memory bitcell, the read operation is performed on the data stored in the one or more respective bitcells.

18. Computer-readable storage medium comprising instructions that, when executed by a processor, cause the processor to perform operations including:

in response to a detection, by a comparator circuitry, of a read operation and a write operation to a same memory bitcell of the multiport memory in one cycle, performing the read operation of a data input signal or a write enable signal from a respective input of the peripheral circuitry to the multiport memory in the one cycle wherein:

the peripheral circuitry is coupled to the comparator circuitry; and the peripheral circuitry comprises one or more data input sections, wherein:

for each data input section:

a first multiplexer is configured to receive the data input signal;

an AND gate is configured to receive the write enable signal; and first and second latches are configured to receive the data input signal and the write enable signal and output the respective signals to an OR gate.

19. The computer-readably storage medium of claim 18, further comprising: in response to the detection, obstructing transmission of one or more output signals on respective read bitlines from the one or more respective bitcells.

* * * * *